United States Patent
Ozgun et al.

(10) Patent No.: US 7,436,251 B2
(45) Date of Patent: Oct. 14, 2008

(54) SYSTEM AND METHOD FOR DYNAMIC POWER-OPTIMIZATION OF ANALOG ACTIVE FILTERS

(75) Inventors: Mehmet T. Ozgun, Dallas, TX (US); Yannis P. Tsividis, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 11/733,977

(22) Filed: Apr. 11, 2007

(65) Prior Publication Data
US 2007/0236282 A1    Oct. 11, 2007

Related U.S. Application Data

(63) Continuation of application No. PCT/US05/38534, filed on Oct. 26, 2005.

(60) Provisional application No. 60/623,470, filed on Oct. 29, 2004.

(51) Int. Cl.
    *G06G 7/12*    (2006.01)

(52) U.S. Cl. ..................................... 327/561; 700/286
(58) Field of Classification Search ................. 700/286; 330/129, 149, 279; 327/156, 553; 445/234, 445/343.1
See application file for complete search history.

(56) References Cited

U.S. PATENT DOCUMENTS

| | | | | |
|---|---|---|---|---|
| 5,675,286 A | * | 10/1997 | Baker et al. | 330/129 |
| 5,912,584 A | * | 6/1999 | Iizuka | 330/85 |
| 6,046,632 A | | 4/2000 | Straw | |
| 6,112,125 A | | 8/2000 | Sandusky | |
| 6,392,452 B2 | * | 5/2002 | Lee | 327/108 |
| 6,970,689 B2 | * | 11/2005 | Khorram | 455/326 |
| 2002/0000843 A1 | * | 1/2002 | Lee | 327/65 |
| 2003/0231055 A1 | * | 12/2003 | Macedo | 330/51 |

* cited by examiner

*Primary Examiner*—Kidest Bahta
(74) *Attorney, Agent, or Firm*—Baker Botts LLP

(57) ABSTRACT

A circuit including two operational amplifiers connected in parallel. For the purpose of this explanation, assume that an equivalent input noise of a circuit with one operational amplifier is too high. Where two operational amplifiers, are connected in parallel, the signals from the operational amplifiers add as currents at the output node of the parallel combination.

16 Claims, 12 Drawing Sheets

| Input Signal Range | Gain Settings of the Blocks and Total Gain (dB) | Composition of the First Stage | Blocks Connected to Signal Path | Blocks with Power On |
|---|---|---|---|---|
| -11 to -30 | Amplifier 246 = -24<br>Amplifier 250 = 0<br>Amplifier 234 = -4 | 1 opamp, 1 C, 1 R | Block 204<br>Amplifier 246 | Block 204<br>Amplifiers 246, 250 |
| -30 to -42 | Amplifier 246 = -24<br>Amplifier 250 = 0<br>Amplifier 234 = 20 | 1 opamp, 1 C, 1 R | Block 204<br>Amplifier 250 | Block 204<br>Amplifiers 246, 250 |
| -42 to -54 | Amplifier 246 = 24<br>Amplifier 250 = 0<br>Amplifier 234 = 20 | 1 opamp, 1 C, 1 R | Block 204<br>Amplifier 250 | Block 204<br>Amplifiers 246, 250 |
| -54 to -63 | Amplifier 246 = 24<br>Amplifier 250 = 0<br>Amplifier 234 = 44 | 1 opamp, 1 C, 1 R | Block 204<br>Amplifier 246 | Block 204<br>Amplifiers 246, 250 |
| -63 to -69 | Amplifier 246 = 24<br>Amplifier 250 = 0<br>Amplifier 234 = 44 | 8 opamps, 2 C, 1/2 R | Blocks 204, 210<br>Amplifier 246 | Blocks 204, 210<br>Amplifiers 246, 250 |
| -69 to -72 | Amplifier 246 = 24<br>Amplifier 250 = 0<br>Amplifier 234 = 44 | 16 opamps, 4 C, 1/4 R | Blocks 204, 210, 216<br>Amplifier 246 | Blocks 204, 210, 216<br>Amplifiers 246, 250 |
| -72 to -75 | Amplifier 246 = 24<br>Amplifier 250 = 0<br>Amplifier 234 = 44 | 32 opamps, 8 C, 1/8 R | Blocks 204, 210, 216, 222<br>Amplifier 246 | Blocks 204, 210, 216, 222<br>Amplifiers 246, 250 |
| -75 to -78 | Amplifier 246 = 24<br>Amplifier 250 = 0<br>Amplifier 234 = 44 | 64 opamp, 16 C, 1/16 R | Blocks 204, 210, 216, 222, 228<br>Amplifier 246 | Blocks 204, 210, 216, 222, 228<br>Amplifiers 246, 250 |

Fig. 2c

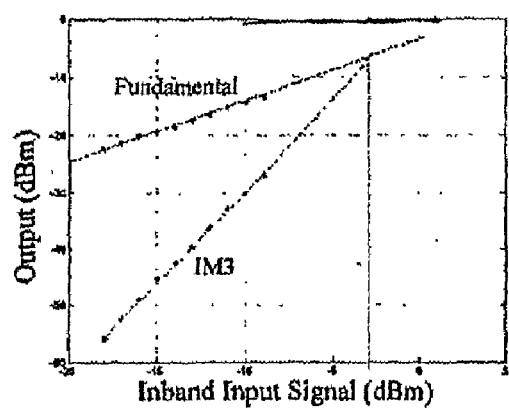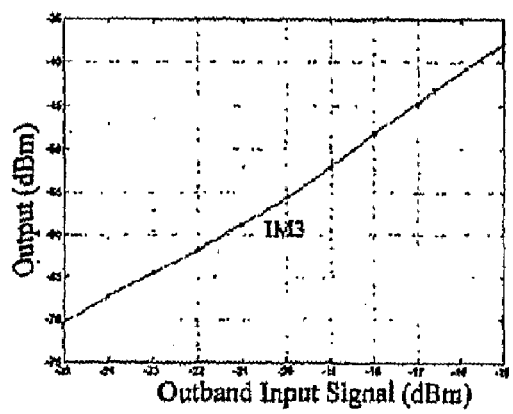
Fig. 4a
Fig. 4b

SYSTEM AND METHOD FOR DYNAMIC POWER-OPTIMIZATION OF ANALOG ACTIVE FILTERS

CROSS-REFERENCE TO RELATED APPLICATION

This application is a continuation of International Application PCT/US05/038534, filed Oct. 26, 2005, which is based on U.S. provisional patent application Ser. No. 60/623,470, filed Oct. 29, 2004, each of which is incorporated by reference herein in its entirety, and from which priority is claimed.

STATEMENT REGARDING FEDERALLY SPONSORED RESEARCH

The invention described herein was funded in part by grants from the National Science Foundation, Grant Number CCR-02-09109. The United States Government may have certain rights under the invention.

BACKGROUND OF THE INVENTION

The present invention relates to techniques for performing analog signal processing, and more particularly, to such techniques having dynamic power-scaling. Such techniques have particular applicability to portable communication applications.

In active filters; large dynamic range necessitates large power consumption. A common way to relax the dynamic range requirements is to use an automatic gain control ("AGC") circuit in front of the filter. Every 3 dB increase in minimum signal level ($V_{min}$) allows increasing the noise floor by 3 dB, which allows a decrease of power consumption and capacitor area by approximately a factor of 2. However, in most wireless receivers, the interferer power limits the allowable AGC gain for $V_{min}$ and makes high power consumption necessary in order to satisfy the signal to noise ratio ("SNR") specification. As a result, the operation of portable application will be shorter due to the limited battery life.

A common solution to this problem is to distribute the AGC operation throughout the filter, further amplifying the signal as interferers are attenuated, which makes possible a reduction of the power consumption of the latter stages of filter. However, the power consumption of the first stages will still be high and constant. Generally, the first stages of a filter (or system) has the highest power consumption.

An alternative solution utilizing two selectable filters, each power-optimized for a different dynamic range, has been proposed in F. Behbahani, et. al., "Adaptive analog IF signal processor for a wide-band CMOS wireless receiver," IEEE *J Solid-State Circuits*, vol. 36, pp. 1205-1217 (August 2001). However, this design has just two power-consumption settings, which may be unnecessarily limiting. Moreover, the output of the circuit unfortunately includes undesirable transients to switching.

Accordingly, there remains a need in the field for a technique for the dynamic power-optimization of analog active filters which permits multiple power level scaling and reduces undesirable transients.

BRIEF SUMMARY OF THE INVENTION

It is an object of the present invention to provide circuitry and techniques for the dynamic power-optimization of analog active filters which permits multiple power level scaling and reduces undesirable transients.

Further objects of the present invention include the avoidance of increasing the chip area required and provide immunity to interferers.

In order to meet these objectives and others that will become apparent with reference to the disclosure herein, techniques are provided for an analog signal processor having dynamic power-scaling.

In a preferred arrangement, an analog signal processor includes a processor input configured to receive an input signal and at least one impedance block. Each impedance block includes an input and an output, where the input of a selected impedance block is connected to the processor input, and where the selected impedance block processes the input signal.

The processor also includes at least one amplifier block and a filter bank. The input of a selected amplifier block is connected to the output of the selected impedance block and the selected amplifier block processes a signal received from the output of the selected impedance block. Each filter bank has an input and an output, where a selected filter banks processes a signal received from the output of the selected amplifier block and provides an output signal to an output of the analog signal processor, and the amplifier block is selected based at least in part on the envelope of the output signal of the analog signal processor.

In an especially preferred embodiment, the power consumption of analog active-RC filters is scaled down as signal conditions improve. Normally, filters are designed for worst-case condition, and consume the same amount of high power even if conditions improve. The present invention thus provides for economy of resources.

The accompanying drawings, which are incorporated and constitute part of this disclosure, illustrate preferred embodiments of the invention and serve to explain the principles of the invention.

BRIEF DESCRIPTION OF THE DRAWINGS

FIG. 2*c* is a chart summarizing the operation of the dynamically power-optimized channel-select filter shown in FIG. 2*a*, in accordance with the principles of the present invention;

FIG. 2*d* is a graph illustrating the frequency response of the filter shown in FIG. 2*a*;

FIG. 4*a* is a graph depicting the IM3 distortion measurements due to the inband signals, in accordance with the principles of the present invention;

FIG. 4b is a graph showing measurements due to outband signals assuming that the inband signal is at its minimum level, in accordance with the principles of the present invention;

Throughout the figures, unless otherwise stated, the same reference numerals and characters are used to denote like features, elements, components, or portions of the illustrated embodiments.

DETAILED DESCRIPTION OF THE INVENTION

Figure 1A:
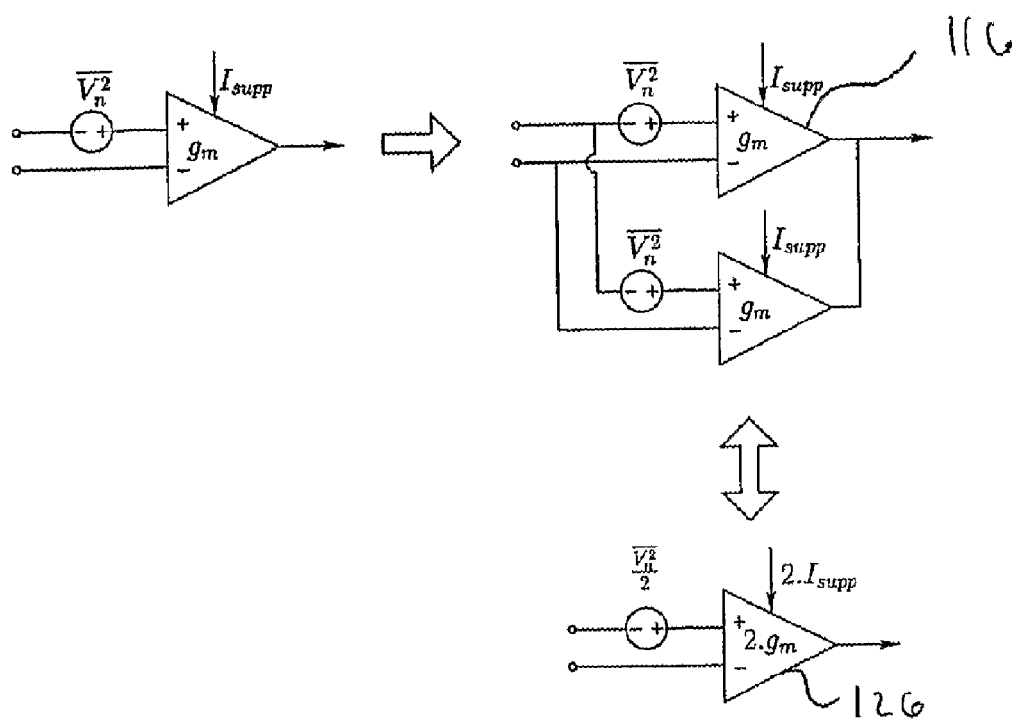
FIG. 1*a* is a functional diagram explaining the principles of the present invention.

Referring first to FIG. 1a, some of the principles of the present invention will now be explained. FIG. 1 shows a circuit including two operational amplifiers 116, 126, connected in parallel. For the purpose of this explanation, assume that an equivalent input noise of a circuit with one operational amplifier is too high. Where two operational amplifiers 116, 126, are connected in parallel, the signals from the operational amplifiers 116, 126 add as currents at the output node of the parallel combination, whereas the uncorrelated noise contributions add as powers. Thus, the input-referred equivalent noise power of the combination is 3 dB lower than the input-referred noise power of a single operational amplifier ("opamp") circuit. The tradeoff-off is an increase in power dissipation by a factor of two. Thus, the noise floor can be reduced at the expense of power dissipation.

Figure 1B:
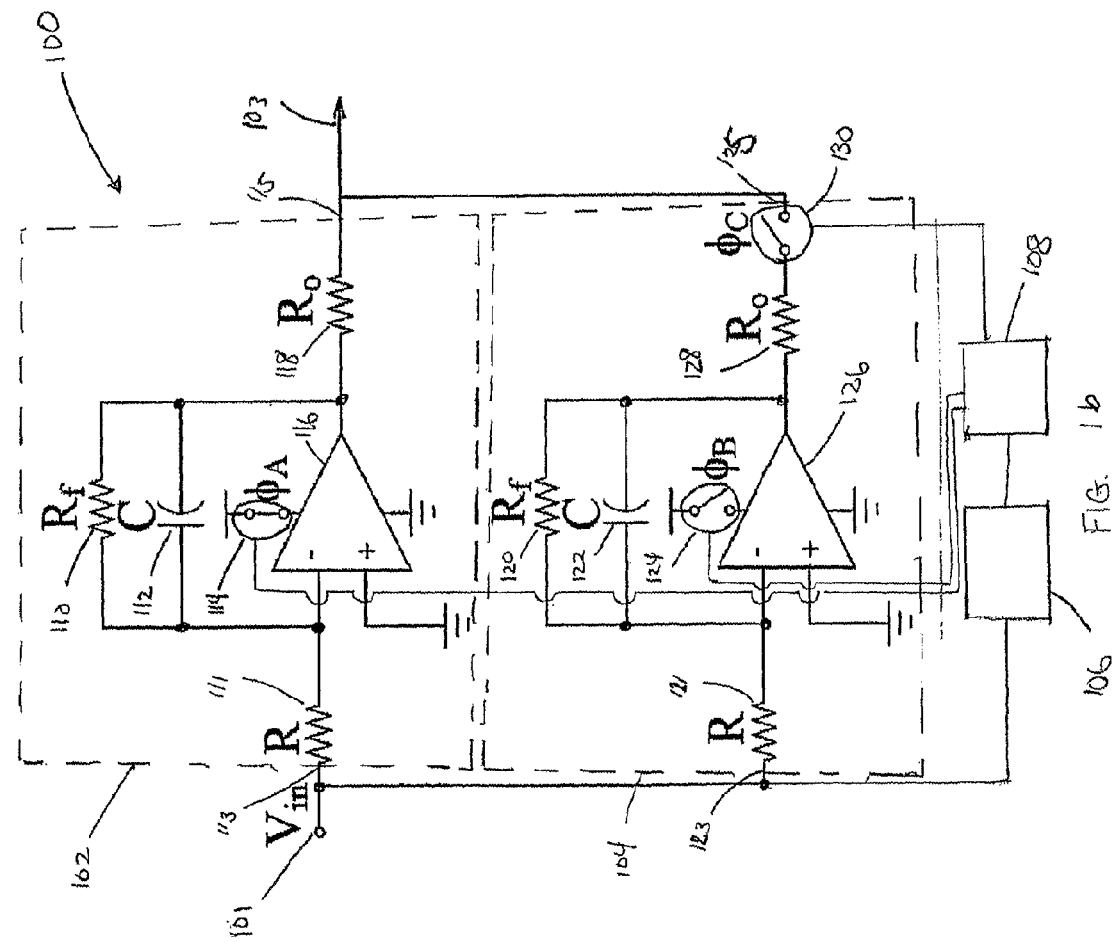
FIG. 1*b* is a circuit diagram of an impedance scaling and dynamic biasing in a first-order active-RC filter 100.
Figure 1C:
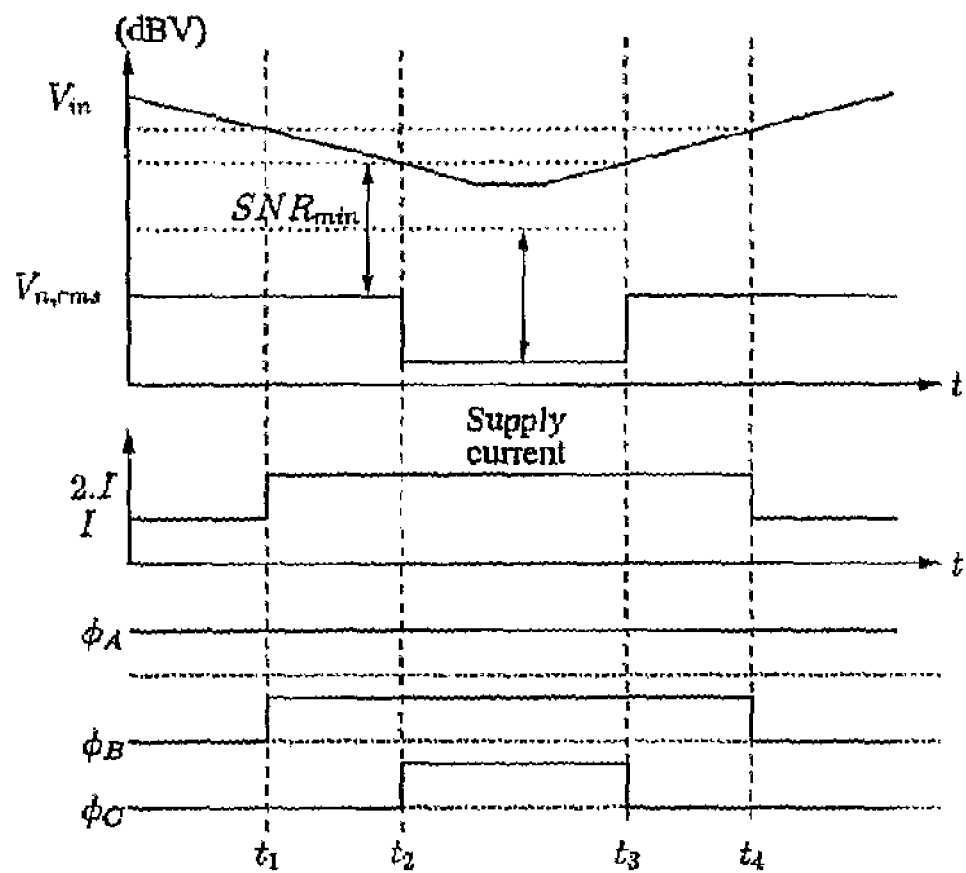
FIG. 1*c* is a timing diagram of the first-order active-RC filter shown in FIG. 1*b*.

FIG. 1b is a block diagram of a first-order active-RC filter circuit, and illustrates impedance scaling and dynamic biasing in the filter 100. FIG. 1c is a timing diagram for the circuit. The filter 100 includes an input 101, an upper first-order filter 102, a lower first-order filter 104, an envelope detector 106, control logic 108, and an output 103. The parallel connection of the upper and lower first-order replica filters 102, 104, as shown in FIG. 1b, results in a first-order filter with the same frequency response as the upper or lower first-order replica filters 102, 104 alone, but having a 3 dB lower noise floor. The input 101 is connected to an input 113 of the upper filter 102, an input 123 of the lower filter 104 and an input of the envelope detector 106 (optional). An output 115 of the upper filter 102 and an output 125 of the lower filter 104 are connected to the output 103. An output of the envelope detector 106 is connected to an input of the control logic 108. As those skilled in the art will appreciate, it may be preferable to have the envelope detector at the output of the filter, due to the relaxed requirements of an envelope detector when it is used after the filter.

The upper filter 102 includes an input 113, resistors 110, 111 and 118, a capacitor 112, a switch 114, an opamp 116, and an output 115. The input 113 is connected to a first terminal of the resistor 111. A second terminal of the resistor 111 is connected to a first terminal of the resistor 110, a first terminal of the capacitor 112 and an input terminal of the opamp 116. Another input terminal of the opamp 116 is connected to ground. A control terminal of the opamp 116 is connected to a first terminal of the switch 114. A second terminal of the switch 114 is connected to the power supply. A control input of the switch 114 is connected to the control logic 108. The output terminal of the opamp 116, a second terminal of the capacitor 112 and a second terminal of the resistor 110 are connected to a terminal of the resistor 118. A second terminal of the resistor 118 is connected to the output 115 of the upper filter 102.

The lower filter 104 is a duplicate of the upper filter 102. The lower filter 104 includes an input 123, resistors 120, 121 and 128, a capacitor 122, switches 124 and 130, an opamp 126, and an output 125. The input 123 is connected to a first terminal of the resistor 121. A second terminal of the resistor 121 is connected to a first terminal of the resistor 120, a first terminal of the capacitor 122 and an input terminal of the opamp 126. Another input terminal of the opamp 126 is connected to ground. A control terminal of the opamp 126 is connected to a first terminal of the switch 124. A second terminal of the switch 124 is connected to the power supply. A control input of the switch 124 is connected to the control logic 108. The output terminal of the opamp 126, a second terminal of the capacitor 122 and a second terminal of the resistor 120 are connected to a terminal of the resistor 128. A second terminal of the resistor 128 is connected to a first terminal of the switch 130. A second terminal of the switch 130 is connected to the output 115 of the lower filter 104. A control input of the switch 130 is connected to the control logic 108.

When the envelope detector 106 detects that the signal power is below a first threshold, the noise floor of the filter 100 can be reduced by parallel connection and operation of the upper and lower filters 102, 104 to satisfy the minimum SNR requirements. This is accomplished by enabling the lower first-order replica filter 104. Upon receiving a signal from the envelope detector 106 indicating that the signal power is below the first threshold, the control logic sends a signal to the switch 124 turning on the lower filter 104 by closing the switch 124. This allows the capacitor 122 to be charged as required by the signal before the lower filter 104 is connected in parallel to the upper filter 102. The lower filter 104 is connected in parallel when the signal power goes below the second threshold, which is the point where, as shown in FIG. 1c, SNR reaches to SNRmin. Before the lower filter 104 is connected in parallel, capacitor 122 is fully charged to reach the same charge value as in capacitor 112, so that the signal at the output node 115 and the output node 125 are substantially identical. This allows elimination or minimization of transients in the output 103, which would be caused by the difference between the charges across the two capacitors if the lower filter 104 was not allowed to be charged up prior to placing it in use.

When the envelope detector 106 detects that the signal power has increased above a second threshold, the very low noise floor is unnecessary and can be allowed to increase by disabling the parallel connection. The parallel connection is disabled by opening the switches 124 and 130. This allows the filter 100 to power down the unused circuitry to reduce the power consumption by a factor of 2.

Figure 2A:
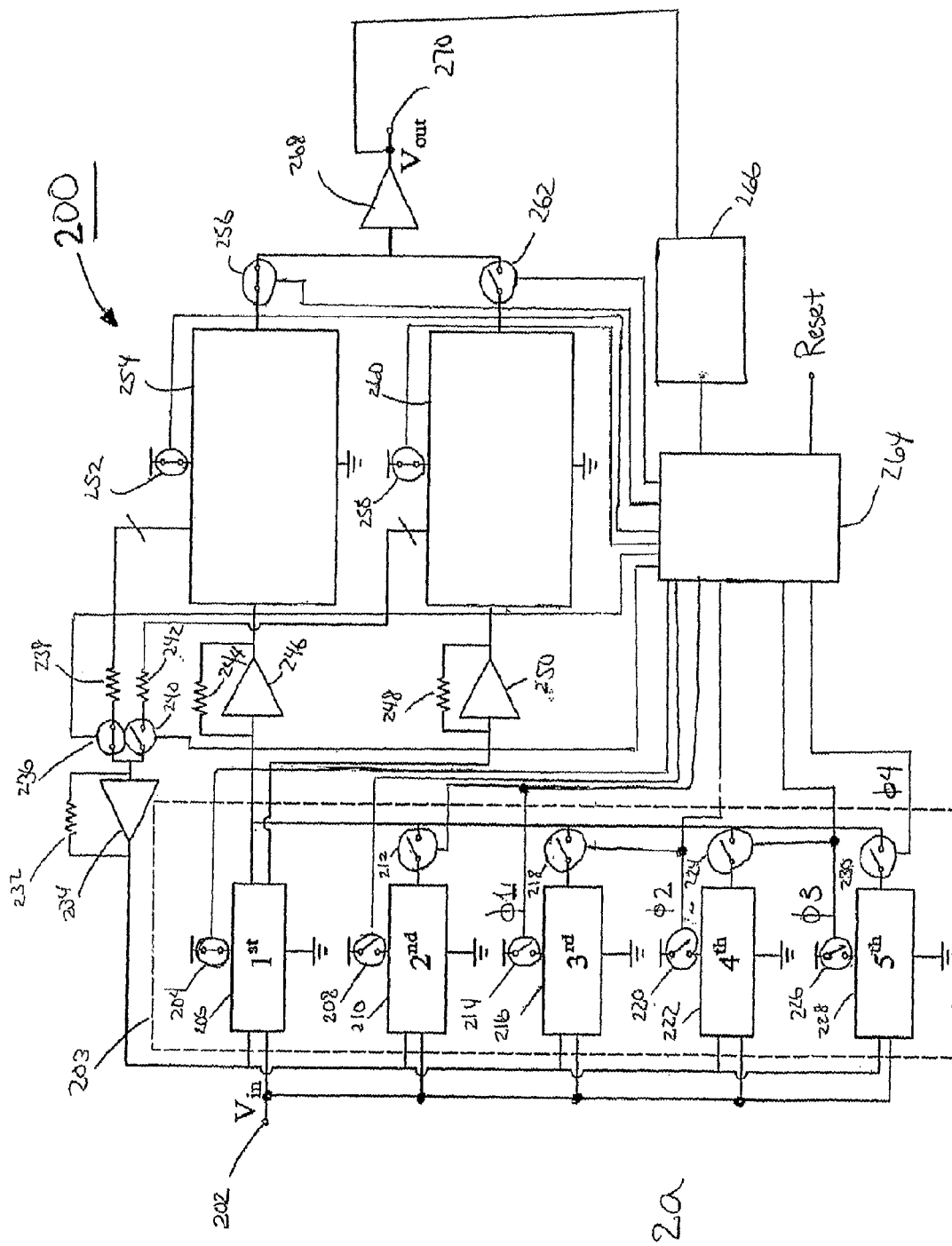
FIG. 2*a* is a block diagram of an exemplary embodiment of a dynamically power-optimized channel-select filter for zero-IF GSM, in accordance with the principles of the present invention.

In accordance with the invention, FIG. 2a illustrates an exemplary embodiment of a dynamically power-optimized channel-select filter 200 for zero-intermediate frequency ("IF") GSM systems. The filter 200 dynamically varies its dynamic range and corresponding required power dissipation to provide a filter having a wide range and low power dissipation. The dynamic range and power dissipation of the filter 200 is dynamically varied depending on signal level, without causing transients at the filter output. The filter 200 utilizes dynamic impedance scaling and dynamic biasing in order to achieve such a wide range and low power dissipation.

Dynamic power-scaling optimizes the power consumption of the filter 200 responsive to the signal level. Preferably, the filter 200 includes dynamic gain allocation, dynamic impedance scaling and/or dynamic biasing. These techniques can be used in most of the analog signal processors, such as filters, amplifiers, and analog-to-digital converters. The filter 200 structure changes dynamically, however there are no transients at the output of the system. Moreover, the dynamic changes are immune to the presence of interferers. The filter 200 is a fifth order channel-select filter for a zero-IF GSM receiver.

FIG. 2a shows the system-level implementation of the filter 200, which is a fully balanced active-RC 5th-order Chebysheff-I low-pass leap-frog filter with 100 KHz bandwidth and 0.1 dB passband ripple in a standard CMOS 0.18 µm process with 1.2V power supply. A first stage 203 includes a first block 206, a second block 210, a third block 216, a fourth block 222 and a fifth block 228. An input 202 of the filter 200 is connected to a first input terminal of the first block 206, a first input terminal of the second block 210, a first input terminal of the third block 216, a first input terminal of the fourth block 222 and a first input terminal of the fifth block 228. The first, second, third, forth and fifth blocks 206, 210, 216, 222, 228 are connected in parallel. A second input terminal of the first block 206, a second input terminal of the second block 210, a second input terminal of the third block 216, a second input terminal of the fourth block 222 and a second input terminal of the fifth block 228 are connected to a first terminal of the resistor 232 and an output terminal of the amplifier 234. A third terminal of the first block 206 is connected to a first terminal of a switch 204. A second terminal of the switch 204 is connected to a power source. A fourth terminal of the first block 206 is connected to ground. A first output terminal of the first block 206 is connected to a first terminal of a resistor 244 and an input terminal of the amplifier 246. A second output terminal of the first block 206 is connected to a first terminal of a resistor 248 and an input terminal of the amplifier 250.

A third terminal of the second block 210 is connected to a first terminal of a switch 208. A second terminal of the switch 208 is connected to the power source. A fourth terminal of the second block 210 is connected to ground. A first output terminal of the second block 210 is connected to a first terminal of a switch 212. A second terminal of the switch 212 is connected to the first terminal of the resistor 244 and the input terminal of the amplifier 246. A third terminal of the third block 216 is connected to a first terminal of a switch 214. A second terminal of the switch 214 is connected to the power source. A fourth terminal of the third block 216 is connected to ground. A first output terminal of the third block 216 is connected to a first terminal of a switch 218. A second terminal of the switch 218 is connected to the first terminal of the resistor 244 and the input terminal of the amplifier 246.

A third terminal of the fourth block 222 is connected to a first terminal of a switch 220. A second terminal of the switch 220 is connected to the power source. A fourth terminal of the fourth block 222 is connected to ground. A first output terminal of the fourth block 222 is connected to a first terminal of a switch 224. A second terminal of the switch 224 is connected to the first terminal of the resistor 244 and the input terminal of the amplifier 246. A third terminal of the fifth block 228 is connected to a first terminal of a switch 226. A second terminal of the switch 226 is connected to the power source. A fourth terminal of the fifth block 228 is connected to ground. A first output terminal of the fifth block 228 is connected to a first terminal of a switch 230. A second terminal of the switch 230 is connected to the first terminal of the resistor 244 and the input terminal of the amplifier 246.

Figure 2B:
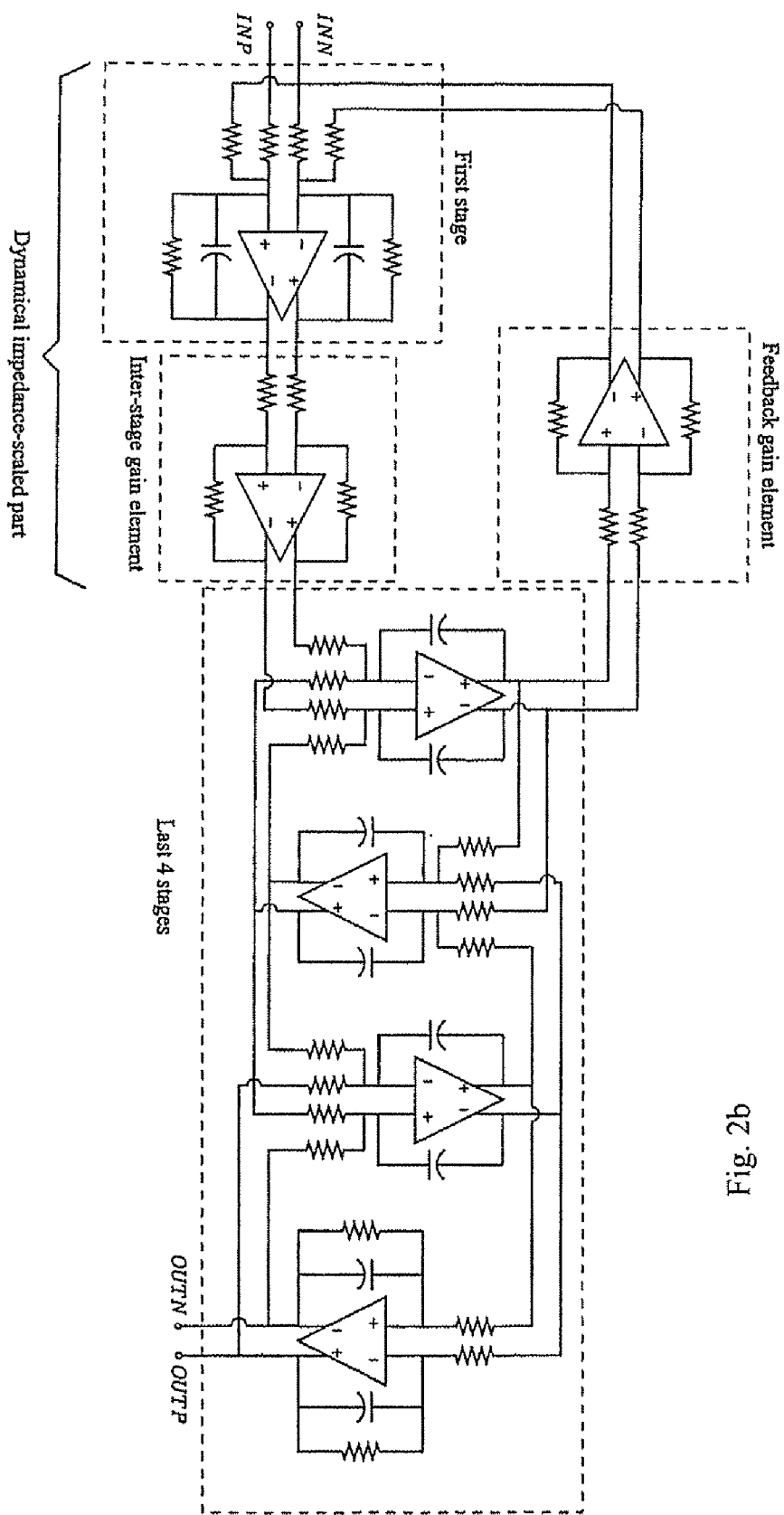
FIG. 2*b* is a simplified circuit level diagram of the embodiment shown in FIG. 2*a*.
Figure 24:
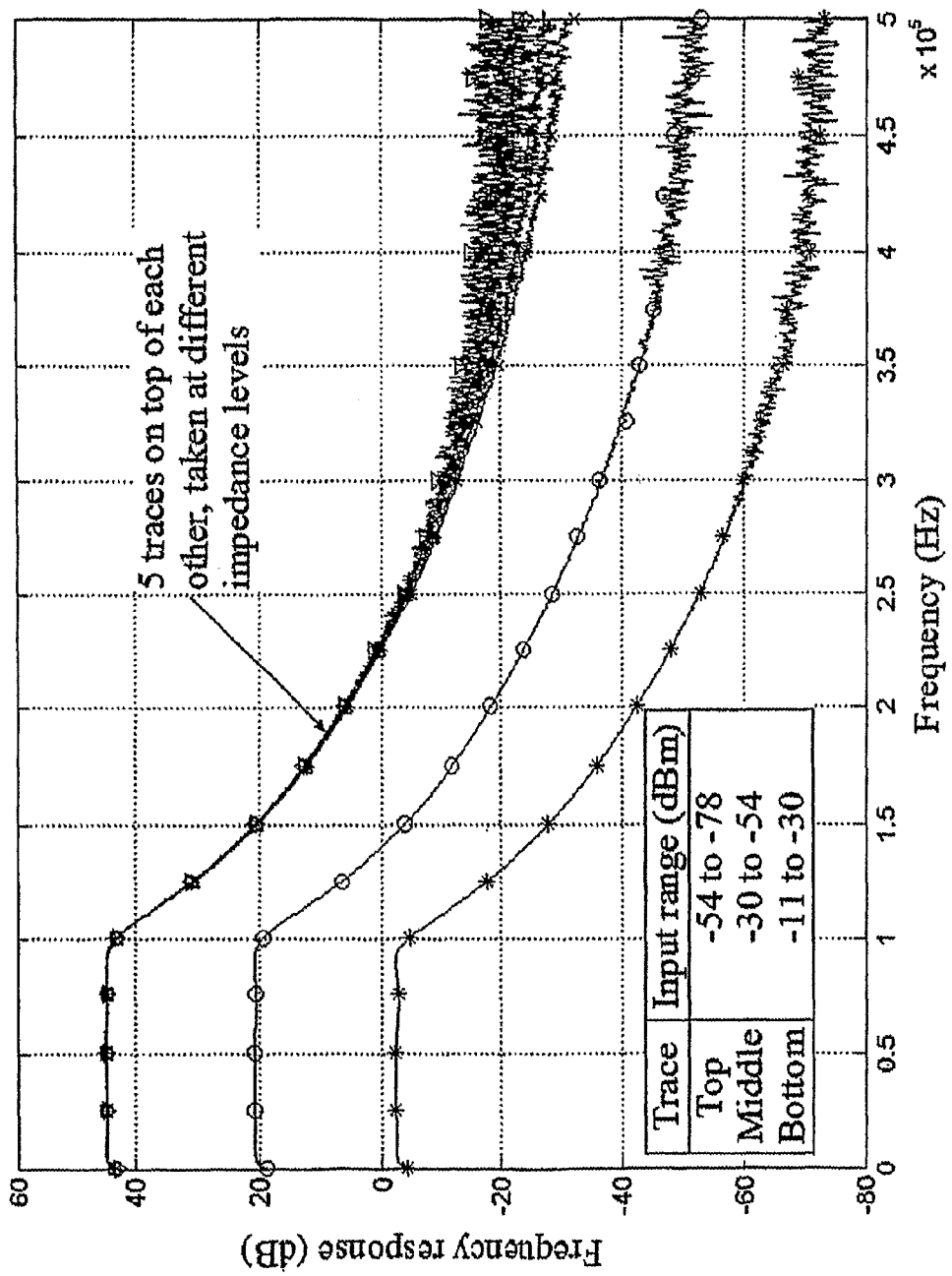
Figure 2E:
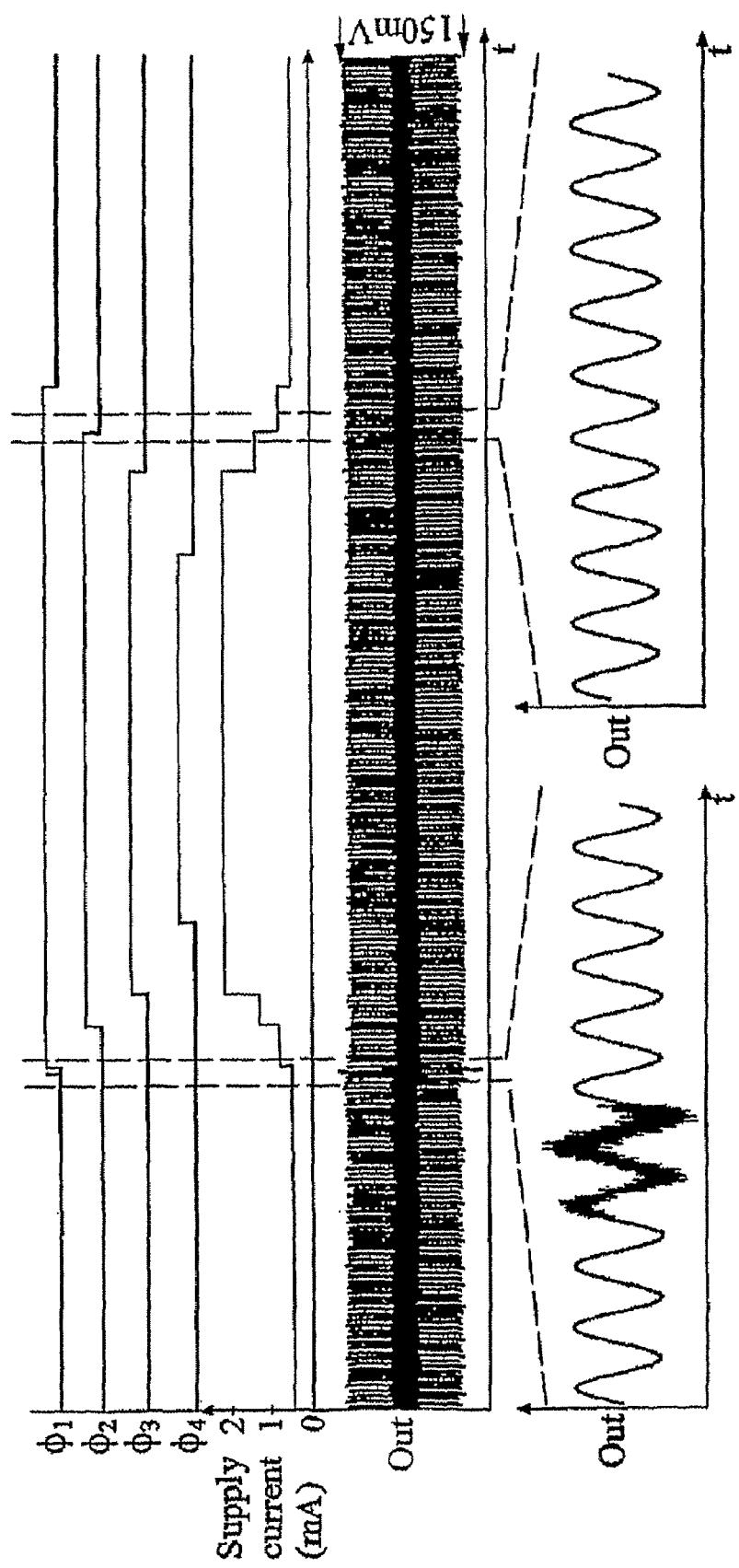
FIG. 2*e* is a waveform diagram showing the control signals and output waveform of the filter shown in FIG. 2*a*.

An output terminal of the amplifier 246 and a second terminal of the resistor 244 are connected to a first terminal of the upper last four stages of the filter 254, as illustrated in FIG. 2b. The upper block 254 includes four filter stages. A second terminal of the upper block 254 is connected to a first terminal of the switch 252. A second terminal of the switch 252 is connected to a power source. A third terminal of the upper block 254 is connected to ground. A fourth terminal of the upper block 254 is connected to a first terminal of the switch 256. A second terminal of the switch 256 is connected to an input terminal of the output driver 268. A bank of terminals of the upper block 254 are connected to a first group of terminals of a resistor array 238. A second group of terminals of the resistor array 238 are connected to a first terminal of the switch 236. A second terminal of the switch 236 is connected to an input of the amplifier 234 and a second terminal of the resistor 232.

An output terminal of the amplifier 250 and a second terminal of the resistor 248 are connected to a first terminal of the lower last four stages of the filter 260. The lower block 260 includes four filter stages. A second terminal of the lower block 260 is connected to a first terminal of the switch 258. A second terminal of the switch 258 is connected to a power source. A third terminal of the lower block 260 is connected to ground. A fourth terminal of the lower block 260 is connected to a first terminal of the switch 262. A second terminal of the switch 262 is connected to the input terminal of the output driver 268. An output terminal of the output driver 268 is connected to an output 270 and an input terminal of an envelope detector 266. A bank of terminals of the lower block 260 are connected to a first group of terminals of the resistor array 242. A second group of terminals of the resistor array 242 are connected to a first terminal of the switch 240. A second terminal of the switch 240 is connected to the input of the amplifier 234 and the second terminal of the resistor 232.

Alternatively, the envelope detector 266 along with controller 264 may be replaced by a digital signal processor configured to detect specific characteristics of an input signal. As those skilled in the art will appreciate, in typical complete receiver architecture, the signal power is monitored to be able to adjust the gain of various blocks along the receiver chain.

An output terminal of the envelope detector 266 is connected to a first input terminal of a control logic 264. A reset line is connected to a second input terminal of the control logic 264. Output terminals of the control logic 264 are connected to control inputs of the switches 204, 208, 212, 214, 218, 220, 224, 226, 230, 236, 240, 252, 256, 258, 262.

First stage blocks 206, 210, 216, 222 and 228 are first-order circuits similar to the upper and lower filters 102, 104 described in relation to FIG. 1b. The first stage blocks 206, 210, 216, 222 and 228 have additional inputs for feedback, as required by the leap-frog structure of the filter 200. The filter has been designed to withstand maximum interference; the filter first stage blocks 206, 210, 216, 222 and 228 is activated only according to the desired signal strength. Control signals are created according to the envelope of the output 270, at which interferers have been largely rejected, dynamic changes inside the filter 200 are not activated by interferers. Signal power at the input of the filter can be as low as −78 dBm and as high as −11 dBm after some AGC operations by the Low Noise Amplifier ("LNA") in the GSM receiver. The 67 dB usable dynamic range is covered with three filter gain settings of −4 dB, 20 dB and 44 dB.

At the first stage 203 of the filter 200, 20 dB constant gain is used by appropriately choosing the input resistance of the stage 203. The discrete AGC operation is introduced after the first stage by using the amplifier blocks 246, 250, each in conjunction with the upper and lower filters 254, 260 of the filter 200. The "divide and conquer" technique, which eliminates the disturbance at the output of the system due to the dynamic gain changes inside the system, is used with the alternating gain settings and implements the discrete AGC operation. While the amplifier 246 is used, the amplifier 250 is set to the next gain setting and makes the capacitors of the lower filter 260 ready to connect to the signal path by charging them to the desired values. The details of the AGC operation according to the signal level are shown in FIG. 2c. The amplifier 246 may be configured to have gain settings of −24 dB and 24 dB, while the amplifier 250 has a fixed gain of 0 dB. As illustrated in FIG. 2c., the amplifier 234 (feedback gain element) is used in the feedback path from the output of the second integrator to the input of first stage 203 to keep the loop gain constant as the amplification of amplifiers 246, 250 change.

In a certain embodiment, the first stage blocks 206, 210, 216, 222 and 228 may include automatic tuning, which can be easily included using capacitor and resistor arrays as described in T. Hollman, et al., "*A 2.7 V CMOS dual-mode baseband filter for PDC and WCDMA*," IEEE J. Solid-State Circuits, vol. 36, pp. 1148-1153, July 2001, the entirety of which is incorporated herein by reference.

There are a total of five impedance levels for the first stage 203 of the filter 200, and they are implemented by parallel connections of blocks 206, 210, 216, 222, 228, as shown in FIG. 2a. The first block 206 (1 opamp, 1 C, 1 R, see FIG. 2c) is defined as the unit block and includes 1 opamp, 1 C and 1 R. It has 1 opamp, a unit capacitor of 6.5 pF, and resistors with values that correspond to specific time constant and gain. The rest of the blocks are modifications of this unit block as specified in FIG. 2c. The second block 210 (8 opamps, 2 C, ½ R) has 8 unit opamps and 2 unit capacitors in parallel, and resistors with half of the values of resistors in the unit block. The third block 216 (16 opamps, 4 C, ¼ R) has 16 unit opamps and 4 unit capacitors in parallel, and resistors with a quarter of the values of resistors in the unit block. The fourth block 222 (32 opamps, 8 C, ⅛ R) has 32 unit opamps and 8 unit capacitors in parallel, and resistors with an eighth of the values of resistors in the unit block. The fifth block 228 (64 opamps, 16 C, 1/16 R) has 64 unit opamps and 16 unit capacitors in parallel, and resistors with one sixteenth of the values of resistors in the unit block. Within each block 206, 210, 216, 222, 228, the parallel connection of the opamps is established by connecting all nodes including the internal nodes in parallel. However, there is no internal node connection between the opamps of the different blocks, in order to reduce the effect of offset discrepancies. The offset of each block is cancelled on board in order not to create DC jumps at the output of the filter during dynamic impedance scaling.

In a preferred embodiment, the opamps are two-stage fully differential opamps as described below.

At −4 dB and 20 dB gain settings of the filter 200 only the first block 206 is in use in the first stage 203, since the signal level is large enough to satisfy the minimum signal to noise ("SNR") requirements with this highest impedance level. When the input signal power is between −54 dBm and −78 dBm, the amplifier 246 is set to 24 dB gain which makes the total gain of the filter 44 dB and the noise contribution of the upper block 254 negligible with respect to the noise contribution of the first stage 203. Thus, at this gain setting, the noise floor of the filter 200 can be reduced as the signal level decreases by enabling the parallel connections (switches 212, 218, 224, 230) between the blocks 206, 210, 216, 222, 228 at the first stage 203 of the filter 200. Every time one of the blocks 206, 210, 216, 222, 228 is connected to the signal path, the next block is powered up, so that the capacitors will be charged up to the desired voltages to be ready in case they will need to be switched to the signal path.

The fully-balanced differential unit opamp consumes 30 µA from 1.2V. Each integrator of the upper and/or lower filter 254, 260 of the filter 200 has one unit opamp. Moreover, the amplifiers 234, 246, 250 are implemented as inverting amplifiers by also using the unit opamp. Thus, 360 µA of the supply current is constant and not scalable. However, with the cost of a few logic gates, 150 µA of this current can be reduced just by powering down the last four stages when they are not in use and powering them up just before they are to be used.

FIG. 2d shows the frequency response of the filter 200 at all possible gain and impedance settings. FIG. 2d shows the supply current and output of the filter 200, while impedance level changes are performed. $\phi_1$, $\phi_2$, $\phi_3$ and $\phi_4$ are control signals for the first stage blocks, as shown in FIG. 2a. The control signal $\phi_1$ is connected to the switches 212 and 214. The control signal $\phi_2$ is connected to the switches 218 and 220. The control signal $\phi_3$ is connected to the switches 224 and 226, while the control signal $\phi_4$ activates the switch 230.

Two-Stage Fully Differential Opamp

Figure 6:
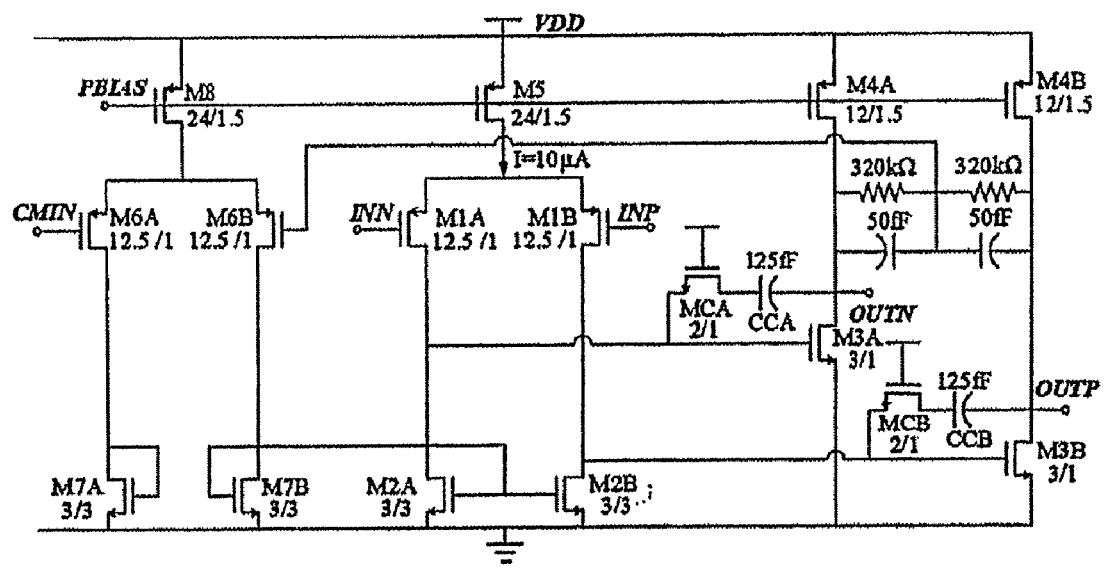
FIG. 6 is a circuit diagram of a two-stage fully balanced operational amplifier in accordance with the principles of the present invention.

FIG. 6 is a circuit diagram of a two-stage fully balanced operational amplifier, in accordance with the principles of the present invention. A p-type differential pair, M1A and M1B, with sources and substrates shorted together are used as the input devices. The M1A and M1B pair is connected to the n-channel load transistors, M2A and M2B, which have longer channel length to reduce the 1/f noise contribution of the devices.

In a preferred embodiment, the M1A and M1B transistors have a width to length ratio of 12.5/1. This ratio is a relative value depending on the particular purpose of the opamp, the transistors that make up the circuit can all be sized accordingly. In the preferred embodiment, the M2A and M2B pair have a have a width to length ratio of 3/3.

The input stage of the opamp is followed with common-source amplifiers, which are implemented with transistors, M3A, M4A, M3B and M4B, and compensation networks. A standard Miller compensation technique is used with MCA, CCA, MCB and CCB. Since a common-mode open-loop bandwidth as large as the differential-mode bandwidth is desired, the second gain stages and the compensation networks are shared for the common-mode operation. Meanwhile, the input stage of the common-mode feedback loop is implemented with a replica of the differential-mode input stage except for the diode connected n-channel load transistors, M7A and M7B. The common mode of the output is sensed with two 320 kΩ resistors in parallel with two high-frequency bypass capacitors of 50 fF. The biasing current flowing through M5 and M8 is 10 µA. And 5 µA flows through M4A and M4B. The total supply current is 30 µA from a 1.2V power supply.

In the preferred embodiment, the M3A and M3B transistors have a have a width to length ratio of 3/3. In the preferred embodiment, the M4A and M4B pair have a have a width to length ratio of 12/1.5. In the preferred embodiment, the MCA and MCB transistors have a have a width to length ratio of 2/1 and the CCA and CCB capacitors are 125 fF. In the preferred embodiment, the M6A and M6B transistors have a have a width to length ratio of 12.5/1 and the M7A and M7B transistors have a have a width to length ratio of 3/3. And finally, in the preferred embodiment, the M5 and M8 transistors have a have a width to length ratio of 24/1.5.

Alternating Divide and Conquer and AGC Operation

Dynamical gain changes inside a filter will cause transients at the output of filter due to existence of memory elements, capacitors. If the filter gain changes continuously, the cancellation of the transients is complicated since it requires the continuous update of the state variables of the filter. However, if filter gain changes in discrete time steps, then the problem turns into an initial-condition problem at the instants of the gain changes. Transients due to discrete gain changes in a filter can be cancelled by switching to a replica of the filter with capacitors that are charged to the desired values before the switching event, as in the "divide and conquer" technique. This technique has been used with alternating gain settings, which enables implementation of all gain settings simply by using two replicas of a filter instead of using one for each gain setting as in G. Palaskas, Y. Tsividis, V. Prodanov and V. Boccuzzi, "A 'Divide and Conquer' Technique for Implementing Wide Dynamic Range Continuous-Time Filters", IEEE J. Solid-State Circuits, vol. 39, pp. 297-307, February 2004, the entirety of which is incorporated herein by reference.

Figure 3:
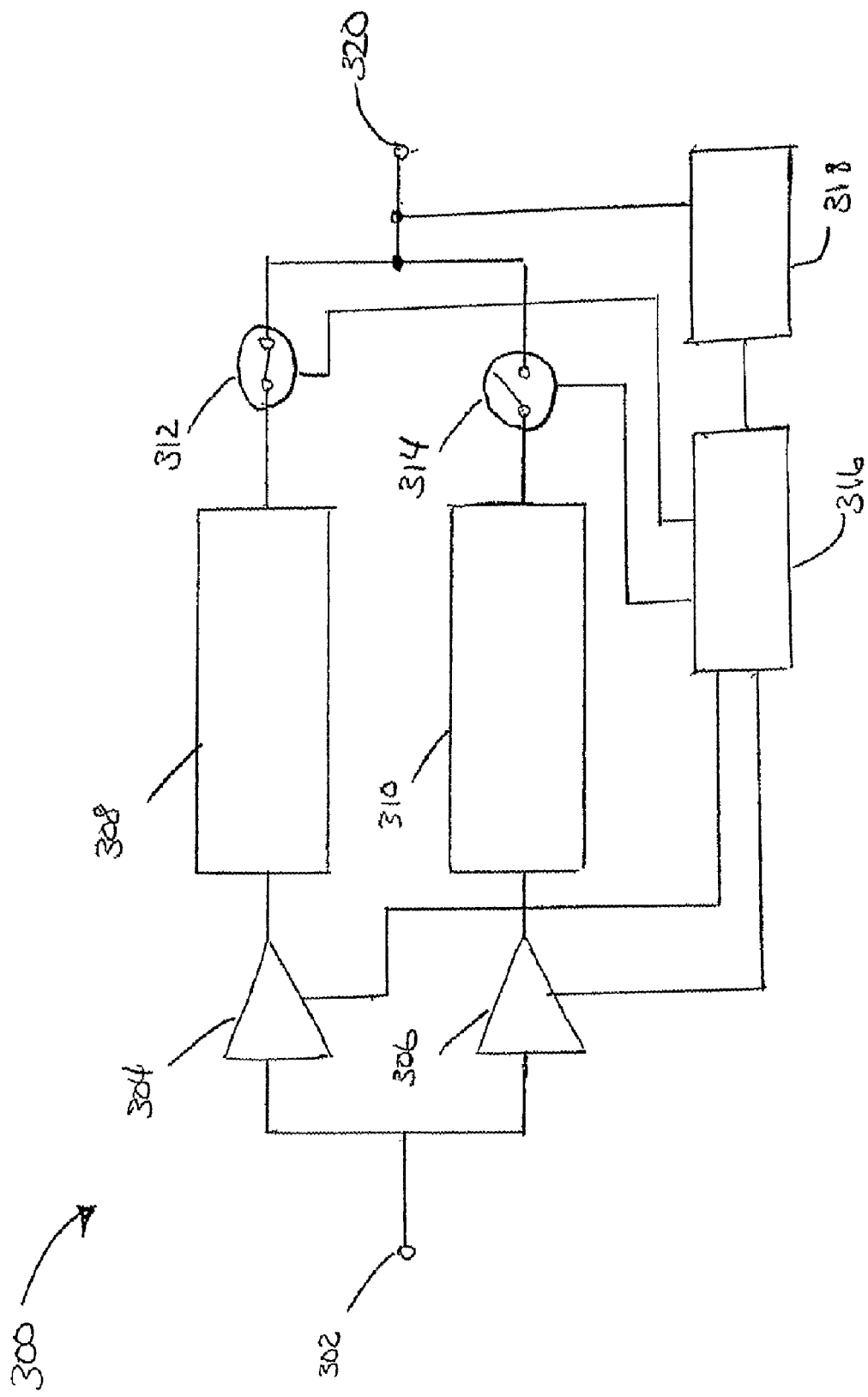
FIG. 3 is a circuit diagram of an alternating divide and conquer filter 300, in accordance with the principles of the present invention.

FIG. 3 is a circuit diagram of an alternating divide and conquer filter 300. The filter 300 includes an input 302, variable amplifiers 304, 306, an upper filter 308, a lower filter 310, switches 312, 314, control logic 316, an envelope detector 318 and an output 320. The input 302 is connected to an input terminal of the amplifier 304 and an input terminal of the amplifier 306. An output terminal of the amplifier 304 is connected to an input terminal of the upper filter 308. An output terminal of the upper filter 308 is connected to a first terminal of the switch 312. A second terminal of the switch 312 is connected to the output 320. An output terminal of the amplifier 306 is connected to an input terminal of the lower filter 310. An output terminal of the upper filter 310 is connected to a first terminal of the switch 314. A second terminal of the switch 314 is connected to the output 320. An input terminal of the envelope detector 318 is connected to the output 320. An output terminal of the envelope detector 318 is connected to an input terminal of the control logic 316. Output terminals of the control logic 316 are connected to a gain control input terminal of the amplifier 304, a gain control input terminal of the amplifier 306, a control input terminal of the switch 312 and a control input terminal of the switch 314. The control logic 316 selects the desired gain setting for the variable gain amplifiers 304, 306 and selects which of the upper and lower filters 308, 310 will be processing the signal. The variable amplifier 304 can be set to gain setting $g_1$, $g_3$ or $g_5$. The variable amplifier 306 can be set to gain setting $g_2$, $g_4$ or $g_6$. The gain settings are such that $g_1$ is the smallest gain setting and $g_6$ is the largest gain setting. The control logic 316 selects the desired gain settings for the amplifiers 304, 306 and selects which of the upper and lower filters 308, 310 will be active based on the envelope of the signal at the output 320.

When the upper filter 308 is in use and the variable amplifier 304 is set at gain setting $g_3$, the control logic 316 will set the gain of the variable amplifier 306 to $g_2$ or $g_4$, and make the lower filter 310 ready to use. The capacitors inside the lower filter 310 are charged up to the desired value before the switching event. When the control logic 316 detects that it is time to change the operating signal pathway from the upper filter 308 to the lower filter 310, the control logic closes the switch 314 and opens the switch 312. No transients will appear at the output 320, only a jump in the value of the signal due to the different gains will appear.

In one embodiment, the filter 300 includes a second gain block with the inverse gain of first gain block after the upper and lower filters 308, 310. Adding these inverse gain blocks makes the filter 300 externally linear time-invariant and the jumps at the output are eliminated.

IM3 Distortion

Application of the AGC operation after the first stage of the filter minimizes the IM3 distortion contribution of the remaining stages of the filter. For maximum receivable signal $G_1$ sets the gain of the following signal path to −24 dB, and reduces the signal level in the remaining stages of the filter. The third order intermodulation distortion ("IM3") distortion of the filter due to the large inband signals is mostly created by the first stage of the filter. FIG. 4a shows the IM3 distortion measurements due to the inband signals, and FIG. 4b shows measurements due to outband signals assuming that the inband signal is at its minimum level, −78 dBm. The two-tone tests for outband signals are realized under the highest gain and lowest impedance settings, which is the worst-case condition.

The IM3 distortion of the filter can be reduced by reducing the constant gain of 20 dB of the first stage. Since low noise floor is not needed for large inband signals, the high gain of the first stage is not necessary in the presence of large inband signals. Thus, introducing an AGC operation at the first stage of the filter instead of a constant gain can improve the performance of the filter from the distortion perspective.

Offset Problems During Impedance Scaling

Figures 5A, 5B:
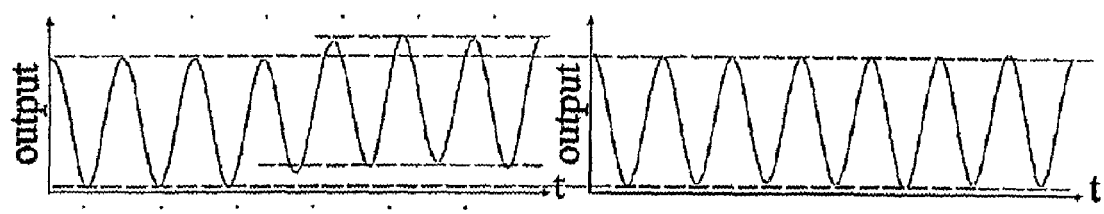
FIG. 5a is a waveform diagram illustrating the output of the filter 200 while the third block 216 is being connected in parallel to the previously connected first and second blocks 206, 210 without any offset cancellation, in accordance with the principles of the present invention.
FIG. 5b is a waveform diagram showing the output of the filter shown in FIG. 2a with offset cancellation, in accordance with the principles of the present invention.

All opamps inside a single block that is used for impedance scaling, i.e. blocks 206, 210, 216, 222, 228, are connected together in parallel including all internal nodes to prevent any offset discrepancies. However, when the blocks are connected in parallel there is no connection between the internal nodes of the opamps of different blocks, i.e. no connection between internal nodes in block 206 and internal nodes in block 210. The parallel connection of the blocks is established by connecting the inputs to the input of the filter and the outputs to the current-summing node of the gain amplifiers. Establishing internal node connections between the two different blocks would result in a transient at the output of the filter until the offset of the combination of two blocks reaches a steady-state value. Connecting the blocks only at the input of the filter and at the current-summing node of the gain amplifiers, leads to a DC jump at the output of the filter due to a difference in offsets. This DC jump can be eliminated either in the DSP after the ADC or at the input of the connecting block by using offset cancellation. FIG. 5a shows the output of the filter while the third block 216 is being connected in parallel to the previously connected first and second blocks 206, 210 without any offset cancellation. As seen in FIG. 5a, there are no transients at the output of the filter due to different offset of the new block, but rather only a DC jump, which can reach several tens of mV due to high gain setting of the filter. In practice, there is a minimal transient, but it is very tiny due to a bandpass characteristic of the last four stages of the filter. On the other hand, FIG. 5b shows the output of the filter with the offset cancellation at the input of each block.

The size of the unit capacitors used in the filter 200 could not be scaled below 6.5 pF due to parasitics. Accordingly, an asymmetric scaling in the number of the opamps at the 2nd block during the impedance scaling exists. When the first and second blocks are connected together, the total number of opamps is 8 with the total capacitance of 13 pF. From the capacitance perspective, there is only one possible scaling left, which reduces the total capacitance by a factor of 2 to the unit capacitance level. To minimize power consumption the total number of opamps was reduced from 8 to 1 during the scaling. Thus, the second block has seven opamps and one unit capacitor.

The foregoing merely illustrates the principles of the invention. Various modifications and alterations to the described embodiments will be apparent to those skilled in the art in view of the teachings herein. It will thus be appreciated that those skilled in the art will be able to devise numerous techniques which, although not explicitly described herein, embody the principles of the invention and are thus within the spirit and scope of the invention.

We claim:

1. An analog signal processor for dynamic power-scaling having an input for receiving an input signal and an output for outputting a power-scaled signal characterized by an envelope, comprising: (a) one or more impedance blocks, each having an input and an output and being selectable such that when selected, the selected impedance block input is connected to the analog signal processor input to receive the input signal, the selected impedance block processes the input signal, and the impedance block processed input signal is provided to the selected impedance block output; (b) one or more amplifier blocks, each having an input and an output and being selectable such that when selected, the input of the selected amplifier block is connected to the output of the selected impedance block to receive the impedance block processed signal, the selected amplifier block amplifies the impedance block processed signal/and the amplified signal is provided to the selected amplifier block output, wherein the selected amplifier block is selected based at least in part by the envelope of the output signal of the analog signal processor; and (c) one or more filter banks, each having an input and an output and being selectable such that when selected, the input of the selected filter bank is connected to the output of the selected amplifier block to receive the amplified signal, the output of the selected filter bank is connected to the output of the analog signal processor, the selected filter bank filters the amplified signal, and the filtered signal is provided to the selected filter bank output.

2. The analog signal processor of claim 1, wherein the selected amplifier block amplifies the signal received from the output of the selected impedance block by an amplification factor based at least in part on the envelope of the output signal of the analog signal processor.

3. The analog signal processor of claim 1, wherein the selected amplifier block amplifies the signal received from the output of the selected impedance block by one of a plurality of amplification factors, the one of the plurality of amplification factors selected based at least in part upon the envelope of the output signal of the analog signal processor.

4. The analog signal processor of claim 1, wherein a second one of the one or more amplifier blocks is selected to amplify the signal received from the output of the selected impedance block based at least in part on the envelope of the output signal of the analog signal processor.

5. The analog signal processor of claim 4, wherein the input of the second amplifier block is directly connected to the selected impedance block.

6. The analog signal processor of claim 4, wherein the output of the second amplifier block is selectively connected to the input of the selected filter bank.

7. The analog signal processor of claim 6, wherein the output of the second amplifier block is not connected to the input of the selected filter bank until transients in the signal produced on the output of the second amplifier block dissipate to inconsequential levels.

8. The analog signal processor of claim 1, wherein each of the filter banks is optimized to process signals having a particular range of envelope values.

9. The analog signal processor of claim 1, wherein a second one of the one or more filter banks is selected to process the signal received from the output of the selected amplifier block based at least in part on the envelope of the output signal of the analog signal processor.

10. The analog signal processor of claim 9, wherein the input of the second filter bank is directly connected to the input of the selected amplifier block.

11. The analog signal processor of claim 9, wherein the output of the second filter bank is selectively connected to the output of the analog signal processor.

12. The analog signal processor of claim 11, wherein the output of the second filter bank is not connected to the output of the analog signal processor until transients in the signal produced on the output of the another filter bank dissipate to inconsequential levels.

13. A method for the dynamic power-optimization of analog active filters, comprising:
(a) receiving an input signal at an analog signal processor which generates a power-scaled output signal characterized by an envelope, (b) selecting one or more impedance blocks, each having an input and an output and being selectable such that when selected, the selected impedance block input is connected to the analog signal processor input to receive the input signal, the selected impedance block processes the input signal, and the impedance block processed input signal is provided to the selected impedance block output; (c) selecting one or more amplifier blocks, each having an input and an output and being selectable such that when selected, the input of the selected amplifier block is connected to the output of the selected impedance block to receive the impedance block processed signal, the selected amplifier block amplifies the impedance block processed signal, and the amplified signal is provided to the selected amplifier block output, wherein the selected amplifier block is selected based at least in part by the envelope of the output signal of the analog signal processor; and (d) selecting one or more filter banks, each having an input and an output and being selectable such that when selected, the input of the selected filter bank is connected to the output of the selected amplifier block to receive the amplified signal, the output of the selected filter bank is connected to the output of the analog signal processor, the selected filter bank filters the amplified signal, and the filtered signal is provided to the selected filter bank output.

14. The method of claim 13, wherein the one or more impedance blocks includes two or more impedance blocks corresponding to two or more impedance values.

15. The method of claim 13, wherein the one or more amplifier blocks includes two or more amplifiers corresponding to two or more amplification factors.

16. The method of claim 13, wherein the one or more filter banks includes two or more filters, each optimized to process signals having a particular range of envelope values.

* * * * *